(12) United States Patent
Oomori

(10) Patent No.: US 7,342,257 B2
(45) Date of Patent: Mar. 11, 2008

(54) OPTICAL TRANSMITTER

(75) Inventor: Hirotaka Oomori, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 514 days.

(21) Appl. No.: 10/766,953

(22) Filed: Jan. 30, 2004

(65) Prior Publication Data
US 2004/0245446 A1    Dec. 9, 2004

(30) Foreign Application Priority Data
Jan. 31, 2003  (JP)  ............................ P2003-024768
Dec. 16, 2003  (JP)  ............................ P2003-418525

(51) Int. Cl.
*H01L 27/15* (2006.01)
(52) U.S. Cl. ...................... 257/81; 257/82; 257/99; 257/E33.075; 257/E33.076
(58) Field of Classification Search ............... 257/81, 257/82, 98, 99, E33.058, E33.075, E33.076; 372/34, 36
See application file for complete search history.

(56) References Cited

U.S. PATENT DOCUMENTS 6,155,724 A  * 12/2000  Ichino et al. ................. 385/92
6,856,475 B2 *  2/2005  Nasu et al. ................. 359/820
2003/0053169 A1 *  3/2003  Nasu et al. ................. 359/133

FOREIGN PATENT DOCUMENTS

| JP | 59-022381 | 2/1984 |
|----|-----------|--------|
| JP | 4-112591  | 4/1992 |
| JP | 9-27655   | 1/1997 |
| JP | 2003-142766 A | 5/2003 |

OTHER PUBLICATIONS

Japanese Office Action Issued in Corresponding Japanese Patent Application No. 2003-418525, dated on Jun. 19, 2007.

* cited by examiner

*Primary Examiner*—Minh-Loan T Tran
(74) *Attorney, Agent, or Firm*—McDermott Will & Emery LLP

(57) ABSTRACT

An optical transmitter of the invention comprises a thermoelectric module, a light emitting device, and a light receiving device. The thermoelectric module comprises a first plate, a second plate, and a thermoelectric transducer. The first plate is made of insulating material. The second plate includes a first region and a second region, and at least the first region is disposed opposite to the first plate. The thermoelectric transducer is interposed between the first plate and the second plate, and is in contact with the first plate and the first region. The light emitting device is supported by the first plate. The light receiving device is mounted on the second region of the second plate, and receives portion of light emitted from the light emitting device.

8 Claims, 5 Drawing Sheets

OPTICAL TRANSMITTER

BACKGROUND OF THE INVENTION

1. Field of the Invention

The present invention relates to an optical transmitter using a thermoelectric module for regulating a temperature of a light emitting device.

2. Related Background of the Invention

In order to stabilize performance of a light emitting device such as a laser diode (LD), there has been known an optical transmitter having a thermoelectric element for adjusting a temperature of the LD (e.g., cf. Japanese Patent Application Laid-Open No. 9(1997)-27655).

The optical transmitter disclosed in the above-mentioned document comprises a thermoelectric module, and the thermoelectric module comprises a first substrate having a substantially circular shape, a second substrate having a larger diameter than the first substrate, and an electronic element to be arranged between the both substrates. An optical semiconductor module is mounted on the first substrate. Stabilization of output wavelength of the optical transmitter is enhanced by the above-described configuration.

However, the thermoelectric module disclosed in the above-mentioned document requires high electric power. An object of the present invention is to provide an optical transmitter configured to reduce electric power consumption of a thermoelectric module therein.

The increase in the electric power consumption by the thermoelectric module in the conventional optical transmitter may be attributed to the fact that many devices including a light emitting device, a thermistor, monitor photodiode (mPD), and the like were placed on the substrate of the thermoelectric module. That is, the devices mounted on the substrate stores the heat even in a idling state (before starting the thermoelectric module), and heat quantity is proportional to the volume of the mounted devices. Accordingly, the heat quantity to be stored is increased when the volume is increased. When the thermoelectric module is started, it is necessary to adjust the temperature appropriately to control the light emitting device while compensating the heat quantity which was stored in the idling state to begin with. However, when there are many devices mounted on the substrate, much quantity of heat should be compensated accordingly. Such heat compensation causes the increase in the electric power consumption.

Moreover, an device to be driven by electric signals, such as the mPD, is connected to a lead terminal via a wire and the like. Accordingly, the outside heat flows into the package through the lead terminal and the wire. Therefore, the compensation of the heat from the outside further causes the increase in the electric power consumption. In the meantime, the mPD needs to be disposed in the vicinity of the light emitting device so as to receive the light outputted therefrom.

As shown in FIG. 5, there is also disclosed an optical transmitter which removes an mPD 104 from a first plate member 101. However, this optical transmitter requires a prism mirror 108, a condenser lens (not shown), and the like to be disposed on the substrate 101 in order to guide light outputted from a light emitting device (LD) 105 to the mPD 104. Therefore, this optical transmitter dose not reduce the number of materials subject to heat absorption. Moreover, there are also problems of an increase in size of the module, deterioration in coupling efficiency caused by an increase in optical path length between the LD and the mPD, and the like. Based on the above-described disclosure, it may be necessary to reduce the number of devices placed on the substrate and thereby to reduce the power consumption.

SUMMARY OF THE INVENTION

An optical transmitter according to the present invention comprises a thermoelectric module, a light emitting device, and a light receiving device. The thermoelectric module comprises a first plate, a second plate, and a thermoelectric transducer. The first plate is made of insulating material. The second plate includes a first region and a second region, and at least the first region is disposed opposite to the first plate. The thermoelectric transducer is interposed between the first plate and the second plate, and is in contact with the first plate and the first region of the second plate. The light emitting device is supported by the first plate. The light receiving device is mounted on the second region of the second plate so as to receive portion of light emitted from the light emitting device.

In the optical transmitter according to the present invention, the first plate is disposed facing the first region of the second plate. Portion of the light emitted from the light emitting device supported by the first plate enters the light receiving device mounted in the second region on the second plate. In this configuration, the light receiving device is not mounted on the first plate.

In the optical transmitter according to the present invention, the first plate may be includes an opening, and portion of the light emitted from the light emitting device enter the light receiving device through the opening.

The optical transmitter of the present invention may further comprise a carrier to be mounted on the first plate. The carrier comprises a supporting surface extending along a predetermined plane intersecting the first plate. The light emitting device is mounted on the supporting surface.

In the optical transmitter of the present invention, a temperature sensor for detecting a temperature of the light emitting device may be mounted on the carrier.

In the optical transmitter of the present invention, the light emitting device may include a first light emitting surface, and a second light emitting surface opposing to the first light emitting surface. The light receiving device receives light emitted from the second light emitting surface.

The optical transmitter of the present invention may further comprise a can case. The can case includes a lens to be optically coupled with the first light emitting surface, and a stem to mount the second plate. The light emitting device, the light receiving device, and the thermoelectric module are housed in the can case.

According to the present invention, electric power consumption is attained by reducing the number of devices to be placed on the first plate, and the volume of the devices on the first plate is reduced. Therefore, it is possible to miniaturize the optical transmitter having the can case.

DESCRIPTION OF THE PREFERRED EMBODIMENTS

Figure 1:
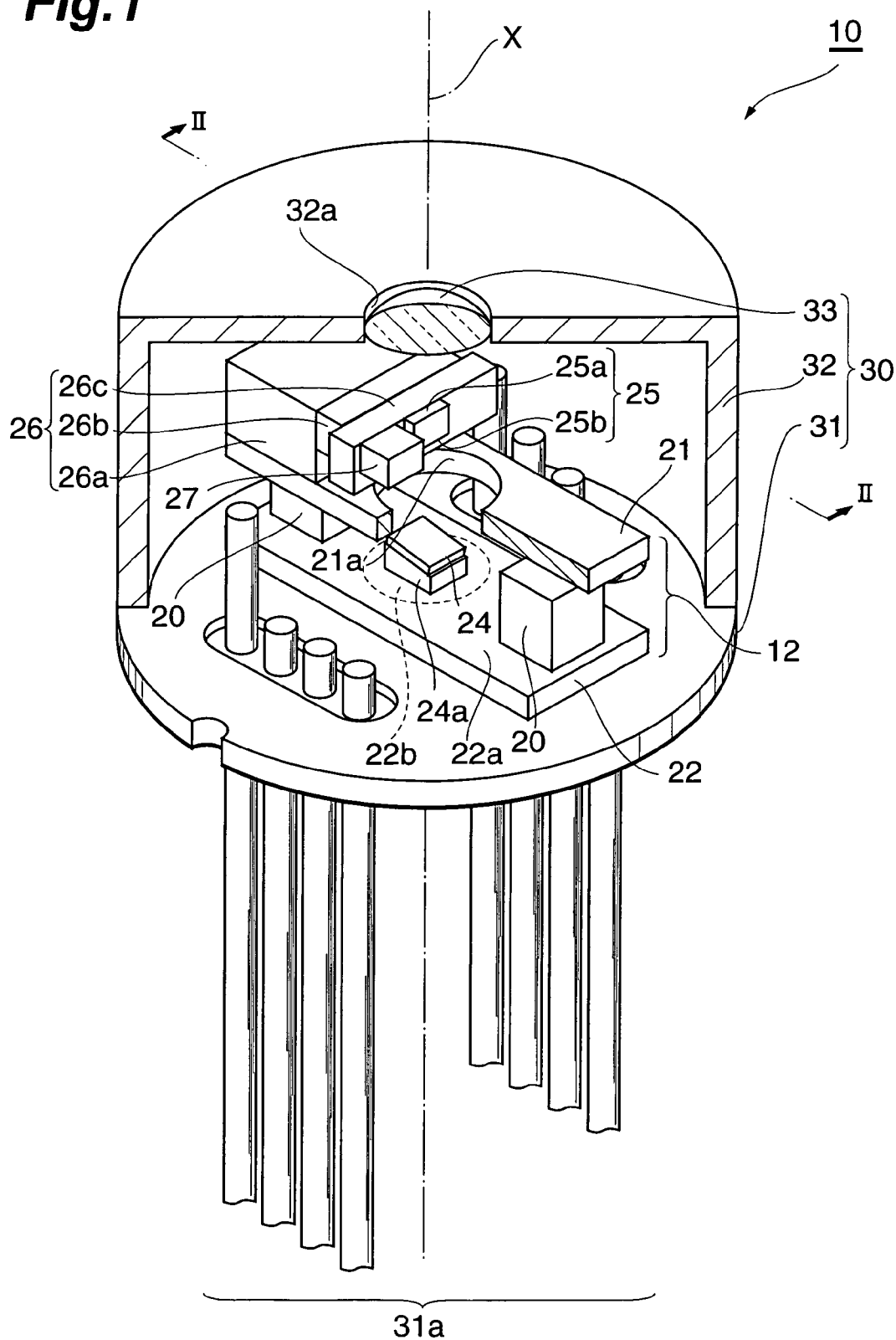
FIG. 1 is a partially exploded perspective view of an optical transmitter according to a first embodiment.

Now, preferred embodiments of the present invention will be described in detail with reference to the accompanying drawings. In the description, identical components or identical portions are denoted by identical reference character, and duplicate explanation will be omitted.

First Embodiment

Figure 2:
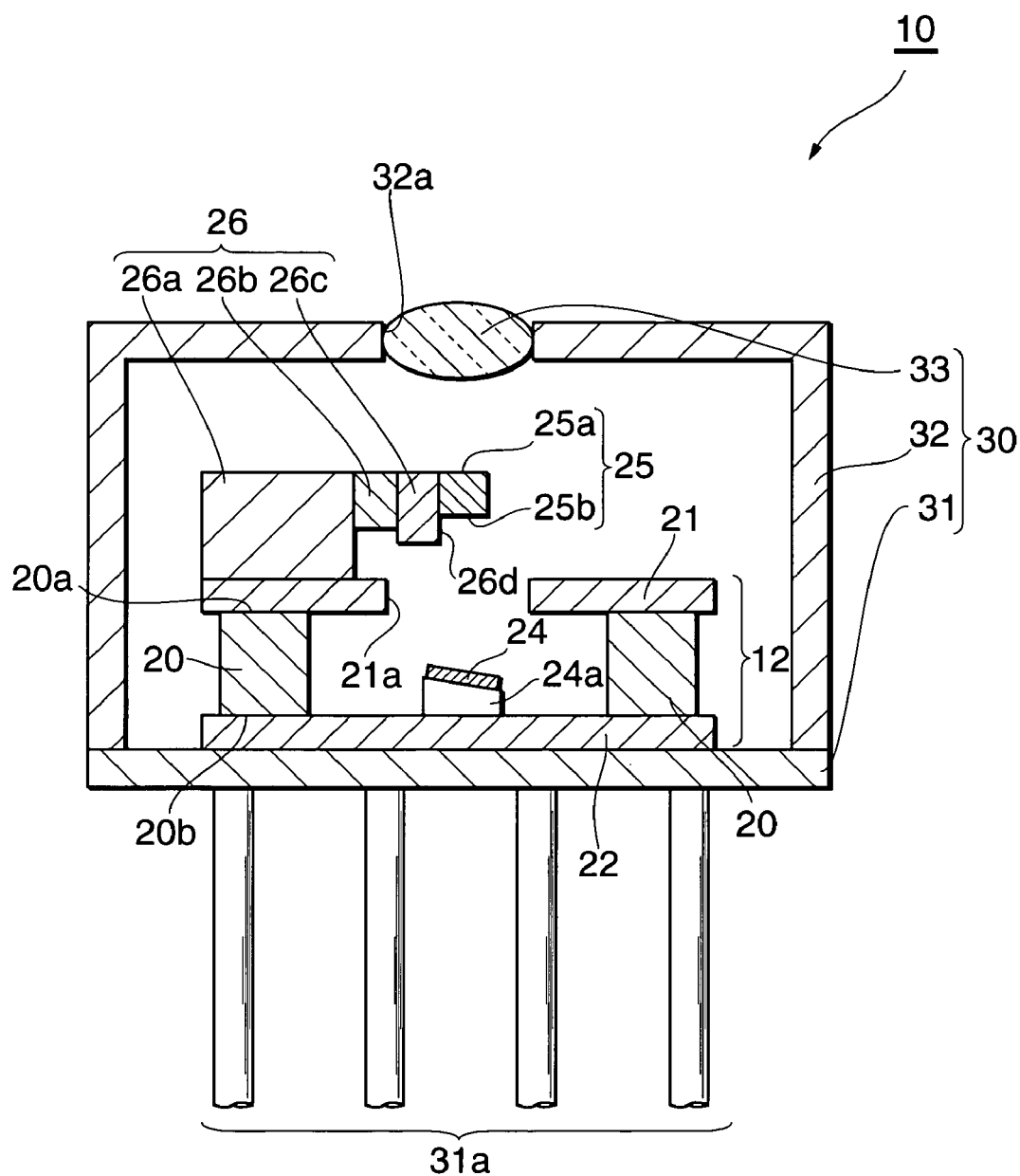
FIG. 2 is a cross-sectional view taken along the II-II line in FIG. 1.

FIG. 1 is a partially exploded perspective view of an optical transmitter 10 according to a first embodiment. FIG. 2 is a cross-sectional view taken along the II-II line in FIG. 1. The optical transmitter 10 includes a thermoelectric module 12, a photodiode (hereinafter referred to as the "PD") 24, a laser diode (hereinafter referred to as the "LD") 25, and a can case 30.

The thermoelectric module 12 comprises a plurality of thermoelectric transducers 20 which are so-called Peltier elements, and a first plate 21 and a second plate 22 for sandwiching the thermoelectric transducer 20. The first plate 21 and the second plate 22 are provided along a plane intersecting a predetermined axis X. Both of the first plate 21 and the second plate 22 are made of insulating material.

An opening 21a is formed on the first plate 21. Although the opening 21a is formed approximately in the center of the first plate 21, the location thereof is not limited to near the center. Moreover, although the opening 21a is formed into a circular shape, the shape thereof may be of any shape other than the circular shape.

The thermoelectric transducer 20 includes a first surface 20a and a second surface 20b. Depending on the direction of an electric current, the first surface 20a constitutes either one of a heat absorbing surface or a heat radiating surface, while the second surface 20b constitutes the other one of the heat absorbing surface or the heat radiating surface.

The first plate 21 is disposed on the first surface 20a of the thermoelectric transducer 20, and the first surface 20a is in contact with the first plate 21. That is, all the first surfaces 20a of the respective thermoelectric transducers 20 are in contact with the first plate 21, and the opening 21a of the first plate 21 is not occluded by the thermoelectric transducers 20. Therefore, the second plate 22 is visible from above the first plate 21 through the opening 21a. The second plate 22 is disposed on the second surface 20b of the thermoelectric transducer 20, and the second surface 20b is in contact with the second plate 22.

A main surface of the second plate 22 includes a first region 22a and a second region 22b. The first region 22a is opposed to the first plate 21 and the second region 22b is opposed to the opening 21a provided on the first plate 21.

The PD 24 is supported on the second region 22b. Therefore, the PD 24 is disposed in the position opposite to the opening 21a. The PD 24 is supported with a chip carrier 24a. The chip carrier 24a includes a surface inclined at an angle with respect to the predetermined axis X, and the PD 24 is mounted on this surface. Therefore, the PD 24 is also inclined at an angle with respect to the predetermined axis X, and reflected light from the PD 24 to the LD 25 is thereby reduced.

Another chip carrier 26, on which the LD 25 is installed, is mounted on the first plate 21. The carrier 26 includes a first block 26a, a second block 26b, and a third block 26c.

The carrier 26 is a member excellent in thermal conductivity, such as a so-called thermal block. The third block 26c has a supporting surface 26d which extends in the direction of the predetermined axis X. The LD 25 is fixed to the supporting surface 26d.

The LD 25 includes a light emitting surface (a first light emitting surface) 25a and a light reflecting surface (a second light emitting surface) 25b. The LD 25 emits the light both in an upward direction and a downward direction (based on the state illustrated in FIG. 1 and FIG. 2). In the following, the light to be emitted in the upward direction will be referred to as "signal light" and the light to be emitted in the downward direction will be referred to as "monitored light".

The LD 25 is disposed in the position so as to allow the monitored light to be passed through the opening 21a of the first plate 21 and to be received by the photodiode 24 provided on the second plate 22. In other words, the LD 25 is fixed to the supporting surface 26d such that the light emitting surface 25a and the light emitting surface 25b intersect the predetermined axis X. In this way, the LD 25 is supported on the first plate 21 with the carrier 26. A thermistor (a temperature sensor) 27 is also fixed to the supporting surface 26d. That is, the thermistor 27 is mounted on the first plate 21 in the vicinity of the LD 25 with the carrier 26, and monitors the temperature around the LD 25.

The can case 30 comprises a stem 31, a lens cap 32, and a lens 33. The stem 31 extends along a plane intersecting the predetermined axis X. The thermoelectric module 12 is placed on the stem 31 while setting the second plate 22 downward. The stem 31 includes a plurality of lead terminals 31a extending in the direction of the predetermined axis X. The lead terminals 31a are electrically connected to the PD 24, the LD 25, and the thermoelectric transducers 20 through metallic wires.

The lens cap 32 is formed into a tubular shape which extends in the direction of the predetermined axis X. The lens cap 32 is provided on the stem 31 and covers the components including the thermoelectric module 12, the PD 24, the LD 25, the carrier 26, the thermistor 27, and the like. Specifically, one end of the lens cap 32 is fixed to the main surface of the stem 31, and the lens cap 32 is thereby supported by the stem 31.

Part of the lens cap 32, that is, the other end thereof has an opening 32a, and the lens 33 is held in the opening 32a. An inner peripheral surface defining the opening 32a constitutes a lens holder for holding the lens 33. The opening 32a is an opening for passing the output light from the LD 25 therethrough. The lens cap 32 is disposed so as to position the opening 32a on an optical axis of the output light (the signal light) from the LD 25. The light passed through the opening 32a is guided to one end of an optical fiber (not shown). That is, the light emitted from the light emitting surface 25a of the LD 25 is efficiently guided to the end of the optical fiber.

The opening 21a is formed on the first plate 21 in the above-described optical transmitter 10. For this reason, it is possible to dispose the PD 24 in the position opposite to the opening 21a on the second plate 22. Moreover, it is possible to achieve the optical transmitter 10 configured to mount the LD 25 and the thermistor 27 for monitoring the temperature thereof on the first plate 21, and to receive the light outputted from the LD 25 and passed through the opening 21a with the PD 24. By adopting such an configuration, it is possible to remove the PD 24, which is one of the devices that store the heat in the idling state, away from the first plate 21, and thereby to reduce the electric power consumption by the thermoelectric module 12. In addition, the thermoelectric module 12 is not required to compensate the heat which flows in from the outside through the wires connected to the photodiode 24. Accordingly, it is possible to reduce the electric power consumption by the thermoelectric module 12.

Furthermore, by adopting the configuration to remove the PD 24 from the first plate 21 of the thermoelectric module 12, the optical transmitter 10 reduces the volume of the devices on the first plate 21 and achieves a compact structure.

Second Embodiment

Figure 3:
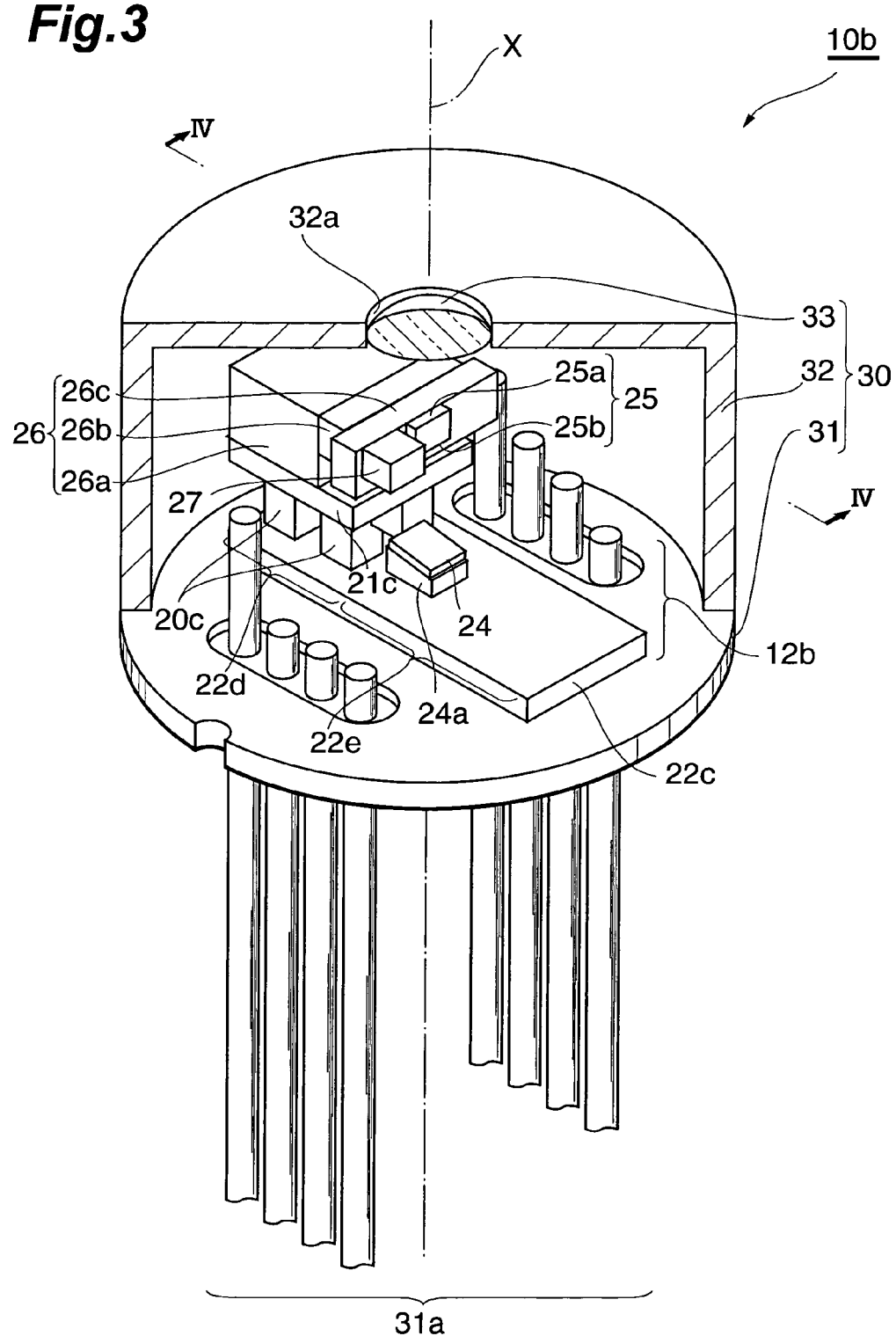
FIG. 3 is a partially exploded perspective view of an optical transmitter according to a second embodiment.
Figure 4:
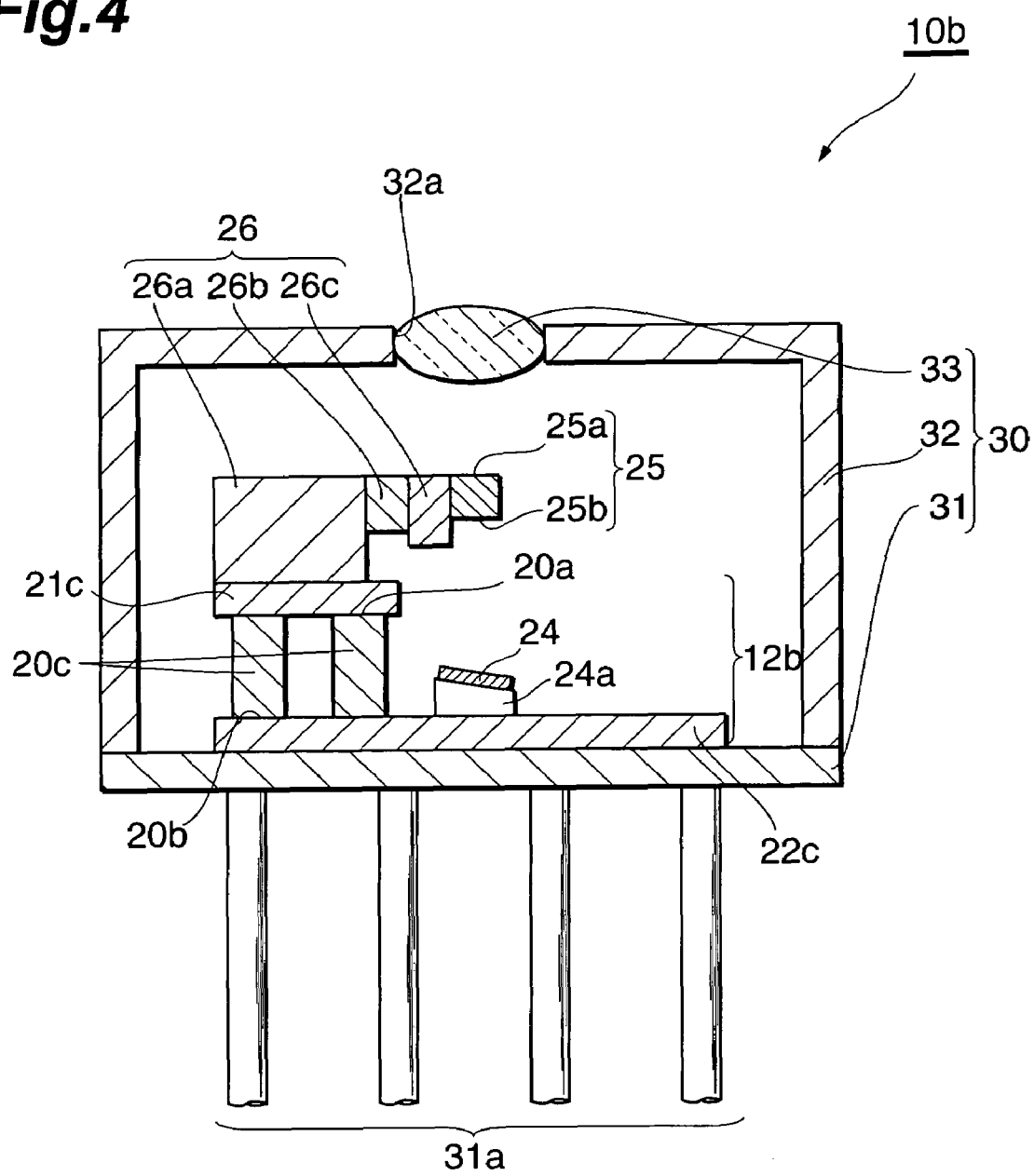
FIG. 4 is a cross-sectional view taken along the IV-IV line in FIG. 3.
Figure 5:
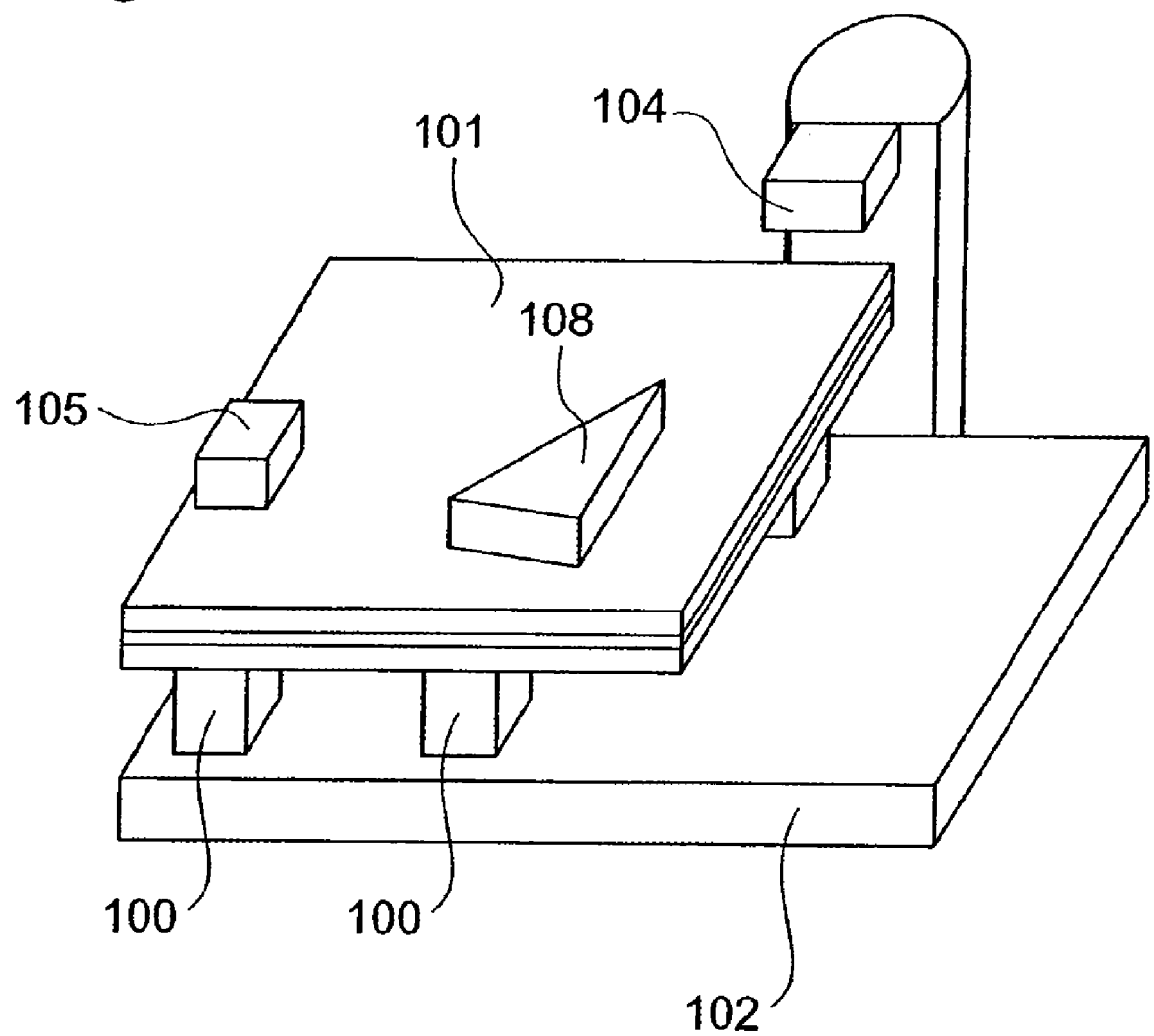
FIG. 5 is a perspective view showing a conventional optical transmitter.

FIG. 3 is a partially exploded perspective view of an optical transmitter 10b according to a second embodiment of the present invention. FIG. 4 is a cross-sectional view taken along the IV-IV line in FIG. 3. The optical transmitter 10b includes a thermoelectric module 12b, the PD 24, the chip carrier 24a, the LD 25, the carrier 26, the thermistor 27, and the can case 30. The thermoelectric module 12b in the optical transmitter 10b is different from that in the optical transmitter 10 of the first embodiment.

The thermoelectric module 12b includes a plurality of thermoelectric transducers 20c, and a first plate 21c and a second plate 22c for sandwiching the thermoelectric transducers 20c. Both of the first plate 21c and the second plate 22c are made of insulating material.

The second plate 22c includes a first region 22d and a second region 22e which are sequentially provided in the direction intersecting the predetermined axis X. The first plate 21c is disposed opposite to the first region 22d of the second plate 22c. In other words, the second plate 22c is larger than the first plate 21c, and part of the second plate 22c (the second region 22e) is visible from the first plate 21c side.

The first plate 21c is disposed on a first surface 20a side of the thermoelectric transducers 20c, and the first surface 20a is in contact with the first plate 21c. The second plate 22c is disposed on a second surface 20b side of the thermoelectric transducers 20c, and the second surface 20b is in contact with the second plate 22c.

The LD 25 is supported by the carrier 26 so as to allow the monitored light to enter the second region 22e. The PD 24 is supported on the second region 22e with a chip carrier 24a. The PD 24 receives the monitored light of the LD 25, which enters the second region 22e.

In the above-described optical transmitter 10b, the monitored light emitted from the LD 25 is passed outside the first plate 21c and is received by the PD 24 supported in the second region 22e on the second plate 22c. By adopting such configuration, it is possible to remove the PD 24, which is one of the devices that store the heat in the idling state, away from the first plate 21c. Therefore, it is possible to reduce the electric power consumption by the thermoelectric module 12b. In addition, the thermoelectric module 12b is not required to compensate the heat which flows in from the outside through the wires connected to the PD 24. Accordingly, it is possible to reduce the electric power consumption by the thermoelectric module 12b.

Furthermore, by adopting the configuration to remove the PD 24 from the first plate 21c of the thermoelectric module 12b, the optical transmitter 10b reduces the envelope volume of the devices on the first plate 21c and achieves a compact structure.

What is claimed is:

1. An optical transmitter comprising:
a thermoelectric module having a first plate made of insulating material, a second plate including a first region and a second region, the first plate being stacked on the first region of the second plate, and a thermoelectric transducer which is interposed between the first plate and the second plate and is in contact with the first plate and the first region of the second plate;
a light emitting device supported by the first plate; and
a light receiving device mounted on the second region of the second plate and configured to receive portion of light emitted from the light emitting device,
wherein an optical axis connecting the light emitting device with the light receiving device is substantially perpendicular to the first plate.

2. The optical transmitter according to claim 1,
wherein the light emitting device includes a first light emitting surface and a second light emitting surface opposing to the first light emitting surface, and
the light receiving device receives light emitted from the second light emitting surface.

3. The optical transmitter according to claim 2, further comprising a can case,
wherein the can case comprises a lens and a stem, the lens being optically coupled with the first light emitting surface, the stem being configured to mount the second plate, and
wherein the light emitting device, the light receiving device, and the thermoelectric module are housed in the can case.

4. The optical transmitter according to claim 1,
wherein the optical axis is substantially perpendicular to the second plate.

5. The optical transmitter according to claim 1,
wherein the first plate includes an opening, and portion of the light emitted from the light emitting device passes through the opening and enters the light receiving device mounted on the second region of the second plate.

6. The optical transmitter according to claim 1,
further comprising a carrier mounted on the first plate, the carrier including a supporting surface extending along a predetermined plane intersecting the first plate, wherein the light emitting device is mounted on the supporting surface.

7. The optical transmitter according to claim 6,
further including a temperature sensor mounted on the carrier for detecting a temperature of the light emitting device.

8. The optical transmitter according to claim 1,
wherein the second region of the second plate is evenly continuing to the first region of the second plate.

* * * * *